United States Patent
Lian et al.

(10) Patent No.: US 10,090,200 B2
(45) Date of Patent: Oct. 2, 2018

(54) BIPOLAR JUNCTION SEMICONDUCTOR DEVICE AND METHOD FOR MANUFACTURING THEREOF

(71) Applicant: Chengdu Monolithic Power Systems Co., Ltd., Chengdu (CN)

(72) Inventors: Yanjie Lian, Chengdu (CN); Daping Fu, Chengdu (CN); Ji-Hyoung Yoo, Cupertino, CA (US)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 15/384,238

(22) Filed: Dec. 19, 2016

(65) Prior Publication Data

US 2017/0186648 A1    Jun. 29, 2017

(30) Foreign Application Priority Data

Dec. 23, 2015    (CN) .......................... 2015 1 0976838

(51) Int. Cl.
| | |
|---|---|
| *H01L 21/8228* | (2006.01) |
| *H01L 29/10* | (2006.01) |
| *H01L 29/08* | (2006.01) |
| *H01L 21/761* | (2006.01) |
| *H01L 27/082* | (2006.01) |
| *H01L 29/732* | (2006.01) |
| *H01L 29/06* | (2006.01) |

(52) U.S. Cl.
CPC ...... *H01L 21/82285* (2013.01); *H01L 21/761* (2013.01); *H01L 27/0826* (2013.01); *H01L 29/0653* (2013.01); *H01L 29/0821* (2013.01); *H01L 29/732* (2013.01); *H01L 29/107* (2013.01)

(58) Field of Classification Search
CPC ............. H01L 21/82285; H01L 21/761; H01L 27/0826; H01L 29/0653; H01L 29/0821; H01L 29/732; H01L 29/107
USPC ......................................... 257/503, 370, 574
See application file for complete search history.

(56) References Cited

U.S. PATENT DOCUMENTS

| | | | |
|---|---|---|---|
| 2010/0032766 A1* | 2/2010 | Chen | H01L 29/0821 257/370 |
| 2010/0244143 A1* | 9/2010 | Yang | H01L 21/82285 257/370 |
| 2014/0015017 A1 | 1/2014 | Yoo et al. | |

(Continued)

OTHER PUBLICATIONS

U.S. Appl. No. 14/970,537, filed Dec. 15, 2015, Monolithic Power Systems.

*Primary Examiner* — Cuong Q Nguyen
*Assistant Examiner* — Tong-Ho Kim
(74) *Attorney, Agent, or Firm* — Perkins Coie LLP

(57) ABSTRACT

A bipolar junction semiconductor device and associated method of manufacturing, the bipolar junction semiconductor device has a P type substrate, a N type buried layer formed in the substrate, a P– type first epitaxial layer formed on the buried layer, a P– type second epitaxial layer formed on the first epitaxial layer, a PNP BJT unit formed in the first and second epitaxial layers at a first active area, a NPN BJT unit formed in the first and second epitaxial layers at a second active area and a first isolation structure of N type formed in the first and second epitaxial layers at an isolation area. The isolation area is located between the first active area and the second active area, the first isolation structure connected with the buried layer forms an isolation barrier.

21 Claims, 12 Drawing Sheets

(56) References Cited

U.S. PATENT DOCUMENTS

2015/0001619 A1    1/2015   Yoo et al.
2015/0187931 A1    7/2015   Yoo et al.

\* cited by examiner

BIPOLAR JUNCTION SEMICONDUCTOR DEVICE AND METHOD FOR MANUFACTURING THEREOF

CROSS-REFERENCE TO RELATED APPLICATIONS

This application claims the benefit of CN application 201510976838.9, filed on Dec. 23, 2015, and incorporated herein by reference.

TECHNICAL FIELD

The present invention generally relates to semiconductor devices, more specifically, the present invention relates to bipolar junction semiconductor devices.

BACKGROUND

The conventional vertical bipolar junction transistor (BJT) cannot isolate fully form the substrate or the well region, which may lead to undesired carrier injected to the substrate and parasitic BJT. In view of this problem, a deep buried layer, usually, is then formed to surround fully the vertical BJT to improve the isolation performance. However, such solution needs extra masks and more complicated process, making high manufacturing cost.

In light of foregoing, there is a need in the art to not only reduce the manufacturing cost but also to raise the current gain of BJT.

SUMMARY

In view of the above requirements, there has been provided, in accordance with an embodiment of the present disclosure, a bipolar junction semiconductor device. The semiconductor device may have a semiconductor substrate with a first conductive type, a first buried layer with a second conductive type, a first epitaxial layer with the first conductive type formed on the first buried layer, a second epitaxial layer with the first conductive type formed on the first epitaxial layer, a PNP bipolar junction transistor (BJT) unit formed in the first and second epitaxial layers at a first active area, a NPN BJT unit formed in the first and second epitaxial layers at a second active area and a first isolation structure having the second conductive type and formed in the first and second epitaxial layers at an isolation area. The isolation area is located between the first active area and the second active area. The first isolation structure connected with the first buried layer forms an isolation barrier with the second conductive type.

BRIEF DESCRIPTION OF THE DRAWING

The present invention can be further understood with reference to the following detailed description and the appended drawings.

The use of the same reference label in different drawings indicates the same or like components.

DETAILED DESCRIPTION

Various embodiments of the technology will now be described. In the following description, some specific details, such as example circuits and example values for these circuit components, devices or process, are included to provide a thorough understanding of embodiments. One skilled in the relevant art will recognize, however, that the technology can be practiced without one or more specific details, or with other methods components, materials, etc.

Throughout the specification and claims, the terms "left," right," "in," "out," "front," "back," "up," "down, "top," "atop", "bottom," "over," "under," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Those skilled in the art should understand that the meanings of the terms identified above do not necessarily limit the terms, but merely provide illustrative examples for the terms.

Figure 1:
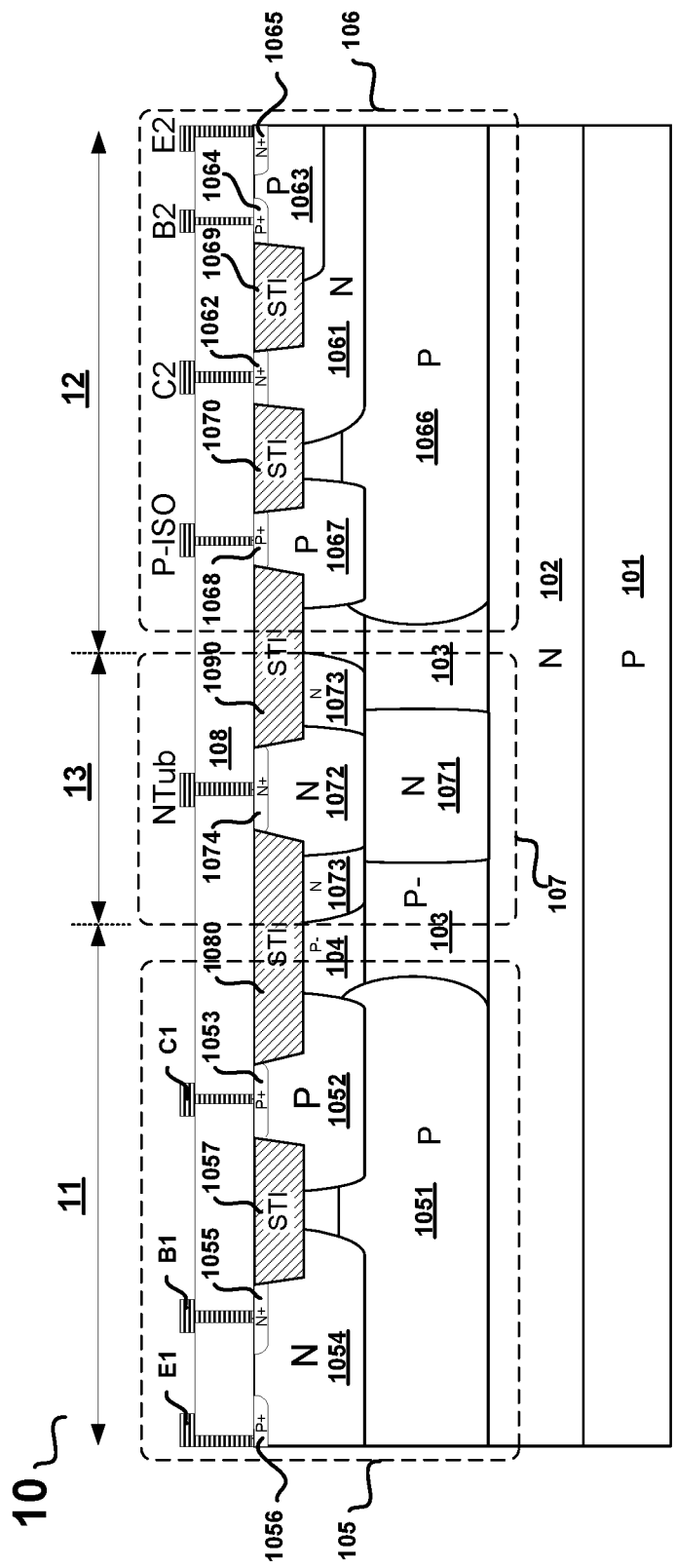
FIG. 1 is a cross-sectional view of a bipolar junction semiconductor device 10 according to one embodiment of the invention.

FIG. 1 is a cross-sectional view of a bipolar junction semiconductor device 10 according to one embodiment of the invention. FIG. 1 is only for illustration purpose and only shows part of the bipolar junction semiconductor device 10. The bipolar junction semiconductor device 10 may be formed on a substrate 101. In one embodiment, the substrate 101 has a first conductive type (such as P type shown in FIG. 1). Embodiments of the invention, however, are not limited to such applications, and the substrate 101 may also comprise silicon substrate, compound substrate containing SiGe or Silicon-On-Insulator (SOI) substrate.

According to one embodiment of the invention, the bipolar junction semiconductor device 10 may be divided into three parts: a first active area 11, a second active area 12 and an isolation area 13. Wherein the first active area 11 is configured to form a PNP BJT unit, the second active area 12 is configured to form a NPN BJT unit, and the isolation area 13 is located between the first active area 11 and the second active area 12, which is configured to form a first isolation structure, thus effectively isolating the PNP BJT unit from the NPN BIT unit. However, those skilled in the art should understand that the meanings of the three-parts division described above do not necessarily limit the boundary, but merely provide illustrative examples for the FIG. 1.

According to one embodiment of the invention, the bipolar junction semiconductor device 10 comprises a first buried layer 102, a first epitaxial layer 103, a second epitaxial layer 104, a vertical PNP BJT unit 105, a vertical NPN BJT unit 106 and a first isolation structure 107. In one embodiment, the first buried layer 102 formed in the substrate 101 and has a second conductive type opposite to the first conductive type (such as N type shown in FIG. 1). The first epitaxial layer 103 is formed on the first buried layer 102 and has the first conductive type (such as p− type shown in FIG. 1), the doping dosage in the first epitaxial layer 103 is less than that in the substrate 101. The second epitaxial layer 104 is formed on the first epitaxial layer 103, has the first conductive type (such as P− type shown in FIG. 1), the doping dosage in the second epitaxial layer 104 is less than that in the substrate 101.

According to one embodiment of the invention, the vertical PNP BJT unit 105 may be formed in the first epitaxial layer 103 and the second epitaxial layer 104 at the first active area 11. The vertical PNP BJT unit 105 may comprises a first collector buried region 1051, a first collector well region 1052, a first collector contact region 1053, a first base well region 1054, a first base contact region 1055 and a first emitter region 1056. The first collector buried region 1051 may be formed in the first epitaxial layer 103 and extends through the first epitaxial layer 103 from the top surface of the first epitaxial layer 103 until the first buried layer 102 is reached. The first collector buried region 1051 has the first conductive type (such as P type shown in FIG. 1). The first collector well region 1052 is formed in the second epitaxial layer 104 and extends through the second epitaxial layer 104 to create an overlap with the first collector buried region 1051. The first collector well region 1052 has also the first conductive type (such as P type shown in FIG. 1). The first collector contact region 1053 is formed in the first collector well region 1052, adjacent to the top surface of the first collector well 1052. The first collector contact region 1053 has the first conductive type (such as P type shown in FIG. 1), and the doping dosage in the first collector contact region 1053 is more than that in the first collector well region 1052. The first base well region 1054 is formed in the second epitaxial layer 104, isolates from the first collector well region 1052 and extends through the second epitaxial layer 104 to contact or have an overlap with the first collector buried region 1051. The first base well region 1054 has the second conductive type (such as N type shown in FIG. 1). The first base contact region 1055 is formed in the first base well region 1054, adjacent to the top surface of the first base well region 1054, has the second conductive type (such as N+ type shown in FIG. 1) and the doping dosage in the first base contact region 1055 is more than that in the first base well region 1054. The first emitter region 1056 is formed in the first base well 1054, adjacent to the top surface of the first base well region 1054 and isolates from the first base contact region 1055. The first emitter region 1056 has the first conductive type (such as P+ type shown in FIG. 1) and the doping dosage in the first emitter region 1056 is more than that in the first collector well region 1052.

In one embodiment, the vertical PNP BJT unit 105 further comprises a shallow trench isolation (STI) region 1057, which located between the first collector well region 1052 and the first base well region 1054 and is configured to isolate the first collector well region 1052 from the first base well region 1054.

In one embodiment, the vertical PNP BJT unit 105 further comprises a collector electrode C1, a base electrode B1 and an emitter electrode E1 respectively coupled to the first collector contact region 1053, the first base contact region 1055 and the first emitter region 1056, thus providing electrical path to the collector, the base and the emitter of the vertical PNP BJT unit 105 in order to apply the appropriate electrical potential in each of them according to the applications.

According to one embodiment of the invention, the vertical NPN BJT unit 106 may be formed in the first epitaxial layer 103 and second epitaxial layer 104 at the second active area 12. The vertical NPN BJT unit 106 may comprises a second collector well region 1061, a second collector contact region 1062, a second base well region 1063, a second base contact region 1064 and a second emitter region 1065. The second collector well region 1061 is formed in the second epitaxial layer 104 and extends through the second epitaxial layer 104 to contact or have an overlap with the first epitaxial layer 103. The second collector well region 1061 has the second conductive type (such as N type shown in FIG. 1). The second collector contact region 1062 is formed in the second collector well region 1061, adjacent to the top surface of the second collector well region 1061. The second collector contact region 1062 has the second conductive type (such as N+ type shown in FIG. 1), and the doping dosage in the second collector contact region 1062 is more than that in the second collector well region 1061. The second base well region 1063 is formed in the second collector well region 1061, isolates from the second collector contact region 1062. The second base well region 1063 has the first conductive type (such as P type shown in FIG. 1). The second base contact region 1064 is formed in the second base well region 1063, adjacent to the top surface of the second base well region 1063, has the first conductive type (such as P+ type shown in FIG. 1) and the doping dosage in the second base contact region 1064 is more than that in the second base well region 1063. The second emitter region 1065 is formed in the second first base well 1063, adjacent to the top surface of the second base well region 1063 and isolates from the second base contact region 1064. The second emitter region 1065 has the second conductive type (such as N+ type shown in FIG. 1) and the doping dosage in the second emitter region 1065 is more than that in the second collector well region 1061.

In one embodiment, the vertical NPN BJT unit 106 further comprises a STI region 1069, which located between the second collector contact region 1062 and the second base contact region 1064 and is configured to isolate the second collector contact region 1062 from the second base contact region 1064.

In one embodiment, the vertical NPN BJT unit 106 further comprises a collector electrode C2, a base electrode B2 and an emitter electrode E2 respectively coupled to the second collector contact region 1062, the second base contact region 1064 and the second emitter region 1065, thus providing electrical path to the collector, the base and the emitter of the vertical NPN BJT unit 106 to apply the appropriate electrical potential in each of them according to the applications.

In one embodiment, the vertical NPN BJT unit 106 further comprises a NPN BJT isolation structure (hereafter referred to as a second isolation structure). In the embodiment shown in FIG. 1, the second isolation structure comprises a second isolation buried region 1066, a second isolation well region 1067 and a second isolation contact region 1068. The second isolation buried region 1066 may be formed in the first epitaxial layer 103 at the second active area 12 and extends though the first epitaxial layer 103 from the top surface of the first epitaxial layer 103 until the first buried layer 102 is reached. The second isolation buried region 1066 has the first conductive type (such as P type shown in FIG. 1). The second isolation well region 1067 is formed in the second epitaxial layer 104 and extends the second epitaxial layer 104 to contact or have an overlap with the second isolation buried region 1066. The second isolation well region 1067 has the first conductive type (such as P type shown in FIG. 1) and isolates from the second collector well region 1061. The second isolation contact region 1068 is formed in the second isolation well region 1067, adjacent to the top surface of the second isolation well region 1067. The second isolation contact region 1068 has the first conductive type (such as P+ type shown in FIG. 1) and the doping dosage in the second isolation contact region 1068 is more than that in the second isolation well region 1067. The active region of the vertical NPN BJT unit 106 formed by combining the second collector well region 1061, the second collector contact region 1062, the second base well region 1063, the second base contact region 1064 and the second emitter region 1065, is wrapped by the second isolation structure which comprises the second isolation buried region 1066 and the second isolation well region 1067 as well as the second isolation contact region 1068, thereby isolating completely the vertical NPN BJT unit 106 from the first buried layer 102, the substrate 101 and other structures. As can be seen, the vertical NPN BJT unit 106 is wrapped by the whole second isolation structure and is isolated from the first buried layer 102 and the substrate 101, additionally, the first buried layer 102 is further configured to isolate the second isolation structure from the substrate 101. Therefore, the fully isolated vertical NPN BJT unit 106 significantly suppresses the injection current to the substrate 101 from a collector region of the vertical NPN BJT unit 106 and the turning-on of parasitic vertical and lateral PNP (such as consisting of Base-Collector-Substrate), wherein the collector region of the vertical NPN BJT unit 106 comprises the second collector well region 1061 and the second collector contact region 1062. The surrounding second isolation structure of the vertical NPN BJT unit 106 acts as pseudo hole collector to collect the hole injected to the substrate 101 from the second collector well region 1061, and with the first buried layer 102 connected to a positive voltage, the stray electrons in the substrate 101 will be greatly absorbed. The stray electron is highly undesirable since it can cause latch up and circuit malfunction. Besides, the fully isolated vertical NPN BJT unit 106 makes it possible to have base-collector forward biased in some special applications, however, it is impossible to do with a conventional NPN BJT.

In one embodiment, the second isolation structure further comprises a STI region 1070, which located between the second isolation contact region 1068 and the second collector region 1062 to isolate the second isolation contact region 1068 from the second collector contact region 1062.

In one embodiment, the second isolation structure further comprises a second isolation electrode P-ISO electrically connected to the second isolation contact region 1068 and configured to apply appropriate electrical potential in the second isolation structure according to the applications.

According to one embodiment of the invention, the first isolation structure 107 comprises a first isolation buried region 1071 and a first isolation well region 1072. The first isolation buried region 1071 is formed in the first epitaxial layer 103 at the isolation area 13 and extends through the first epitaxial layer 103 from the top surface of the first epitaxial layer 103 until the first buried layer 102 is reached. The first isolation buried region 1071 has the second conductive type (such as N type shown in FIG. 1). The first isolation well region 1072 is formed in the second epitaxial layer 104 at the isolation area 13 and extends through the second epitaxial layer 104 to contact a part of the first isolation buried region 1071. The first isolation well region 1072 has the second conductive type (such as N type shown in FIG. 1). In the embodiment shown in FIG. 1, the first isolation structure 107 comprising the first isolation buried region 1071 and the first isolation well region 1072 is connected to the first buried layer 102 to form an isolation barrier with the second conductive type, which is configured to isolate the vertical PNP BJT unit 105 from the vertical NPN BJT unit 106, the second isolation electrode P-ISO and the substrate 101, and thus the injection of the carrier to the substrate 101 and the parasitic BJT are prevented. In one embodiment, the first isolation structure 107 further comprises a first isolation contact region 1074, which is formed in the first isolation well region 1072, adjacent to the top surface of the first isolation well region 1072. The first isolation contact region 1074 has the second conductive type (such as N+ type shown in FIG. 1), the doping dosage in the first isolation contact region 1074 is more than that in the first isolation well region 1072. In one embodiment, the first isolation structure 107 further comprises a first isolation electrode NTub electrically connected to the first isolation contact region 1074 and configured to be applied with appropriate electrical potential for the first isolation structure 107 according to the applications. The first isolation contact region 1074 is configured to reduce the contact resistance between the first isolation structure 107 and the first isolation electrode NTub.

According to one embodiment of the invention, the first isolation structure 107 further comprises a first isolation shallow well region 1073, which is formed in the second epitaxial layer 104 at the isolation area 13 and extends though the second epitaxial layer 104 to contact with a part of the isolation buried region 1071. In this embodiment, the first isolation well region 1072 may be formed in the first isolation shallow well region 1073, that is, the first isolation well region 1072 is wrapped by the first isolation shallow well region 1073. The first isolation shallow well region 1073 has the second conductive type (such as N type shown in FIG. 1), the doping dosage in the first isolation shallow well region 1073 may be less than that in the first isolation well 1072. The first isolation shallow well region 1073 is configured to elevate the break voltage between the first isolation electrode NTub and the second epitaxial layer 104.

In one embodiment, the bipolar junction semiconductor device 10 further comprises a first STI region 1080 and a second STI region 1090. The first STI region is roughly located between the PNP BJT unit 105 and the first isolation structure 107 and is configured to isolate the PNP BJT unit 105 from the first isolation structure 107. The second STI region 1090 is roughly located between the NPN BJT unit 106 and the first isolation structure 107 and is configured to isolate the NPN BJT unit 106 from the first isolation structure 107.

The advantages of the various embodiments of the bipolar junction semiconductor device 10 shown in FIG. 1 are not confined to those described above. These and other advantages of the various embodiments of the present invention will become more apparent upon reading the whole detailed descriptions and studying the various figures of the drawings.

FIGS. 2 to 12 are cross-sectional views showing the progression of method in manufacturing a bipolar junction semiconductor device 10 according to one embodiment of the invention. It should be appreciated that the following detailed description of FIGS. 2-12 is merely exemplary. For the sake of convenience, in the following description, a forming method based on BCD process is considered. The BCD process for making an integrated circuit involves the formation for bipolar devices, CMOS and DMOS.

Several of the details of the embodiments in forming a bipolar junction semiconductor device 10 described below with reference to FIGS. 2-12. Compared with the conventional lateral PNP transistor, the fully isolated vertical PNP BJT unit 105 has a higher current gain and current gain sag characteristic, and the current skin effect of the emitter is reduced. The fully isolated vertical NPN BJT unit 106 significantly suppresses the injection current to the substrate 101 from the collector region of the vertical NPN BJT unit 106 and the turning-on of parasitic vertical and lateral PNP (such as consisting of Base-Collector-Substrate). The surrounding second isolation structure of the vertical NPN BJT unit 106 acts as pseudo hole collector to collect the hole injected to the substrate 101 from the collector region, and with the first buried layer 102 connected to a positive voltage, the stray electrons in the substrate 101 will be greatly absorbed. The stray electron is highly undesirable for it can cause latch up and circuit malfunction. Besides, the fully isolated vertical NPN BJT unit 106 makes it possible to have base-collector forward biased in some special applications, however, it is impossible to do with a conventional NPN BJT.

Figure 2:
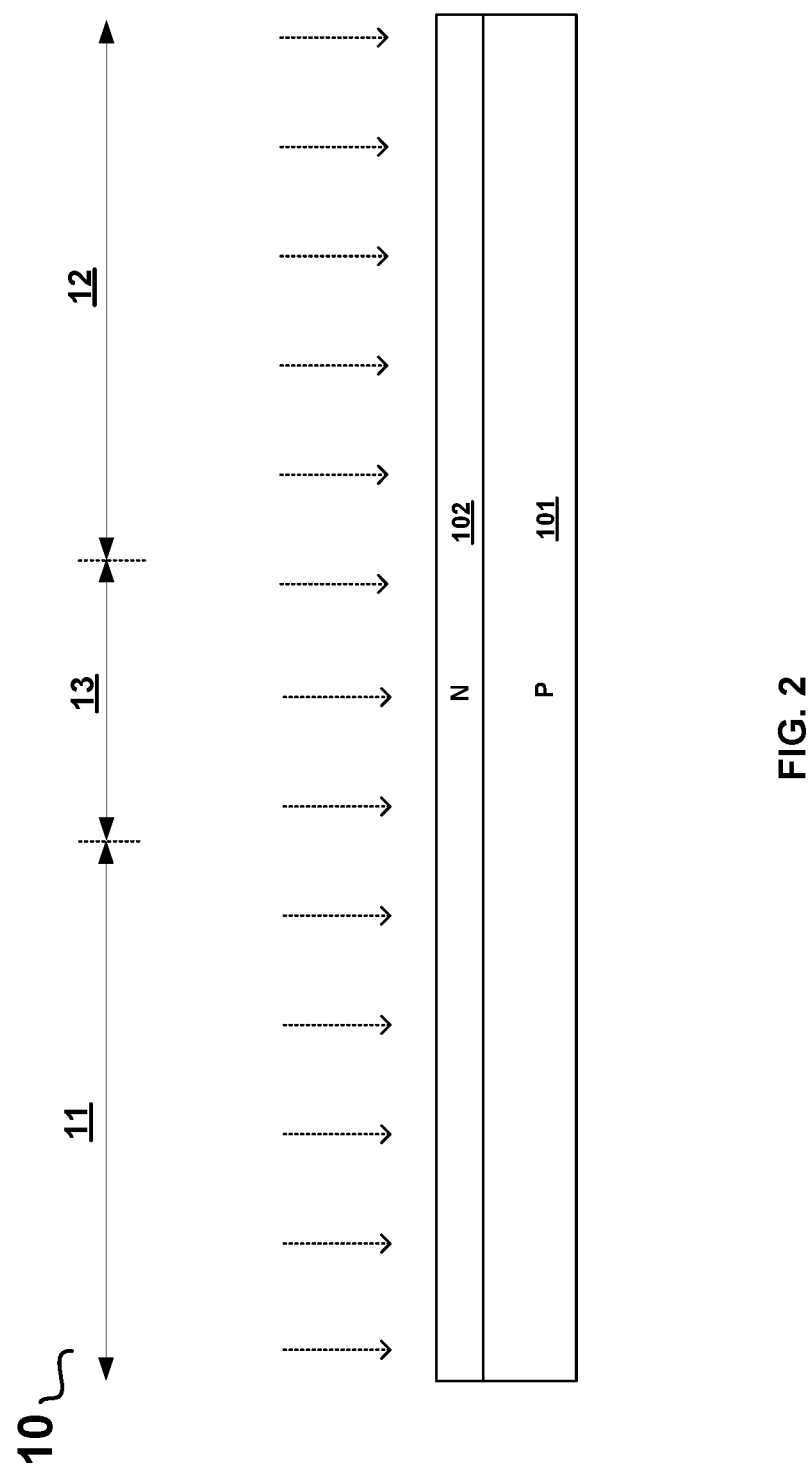
FIGS. 2 to 12 are cross-sectional views showing the progression of method in manufacturing a bipolar junction semiconductor device 10 according to one embodiment of the invention.

Referring to FIG. 2, at first a semiconductor substrate 101 with a first conductive type (P type) is provided, and then a first buried layer 102 with a second conductive type (N type) is formed in the semiconductor substrate 101. In one embodiment, the first buried layer 102 may be formed by extending in the substrate 101 from the top surface of the substrate 101 until a predetermined buried depth is reached. In one embodiment, the first buried layer 102 may be formed in the substrate 101 by ion implantation using ions of the second conductive type. Those skilled in the art should understand that the first buried layer 102 may be finally formed by performing ion diffusion after the ion implantation.

Figure 3:
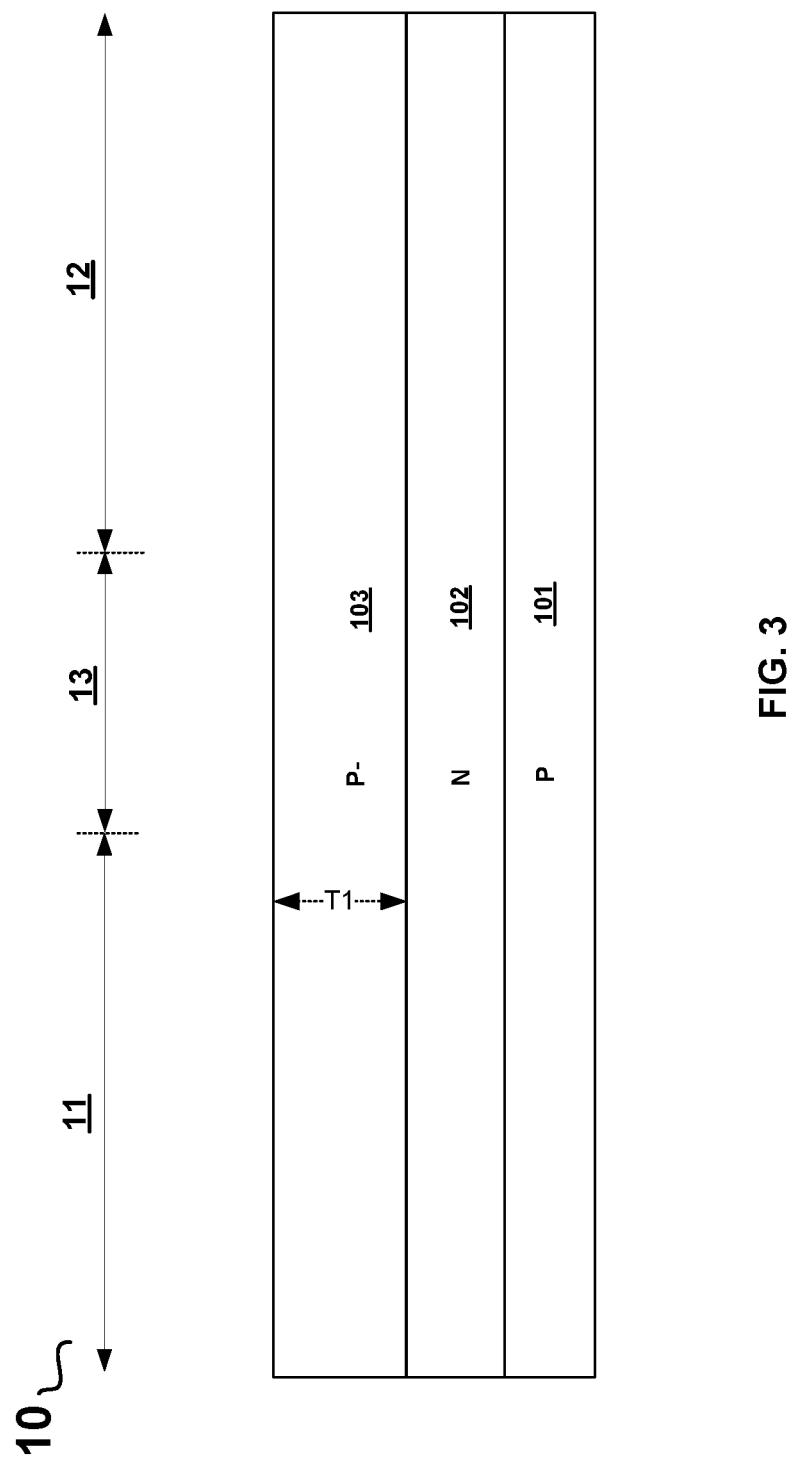

Subsequently, referring to FIG. 3, a first epitaxial layer 104 is formed on the first buried layer 102 and has the first conductive type (N– type), the doping dosage in the first epitaxial layer 103 is less than that in the substrate 101. The first epitaxial layer 103 has a first thickness T1 related to the current gain of the parasitic BJT during the formation of DMOS with the same process. The more the first thickness T1, the less the current gain of the parasitic BJT. However, the contact resistance between the first buried layer 102 and the first isolation structure 107 formed in the following steps may be too high if the first epitaxial layer 103 is too thick, so the first thickness T1 needs be designed according to the diverse applications. For example, in one embodiment, the first thickness T1 is in the range form, but not limited to 4 μm to 10 μm.

Figure 4:
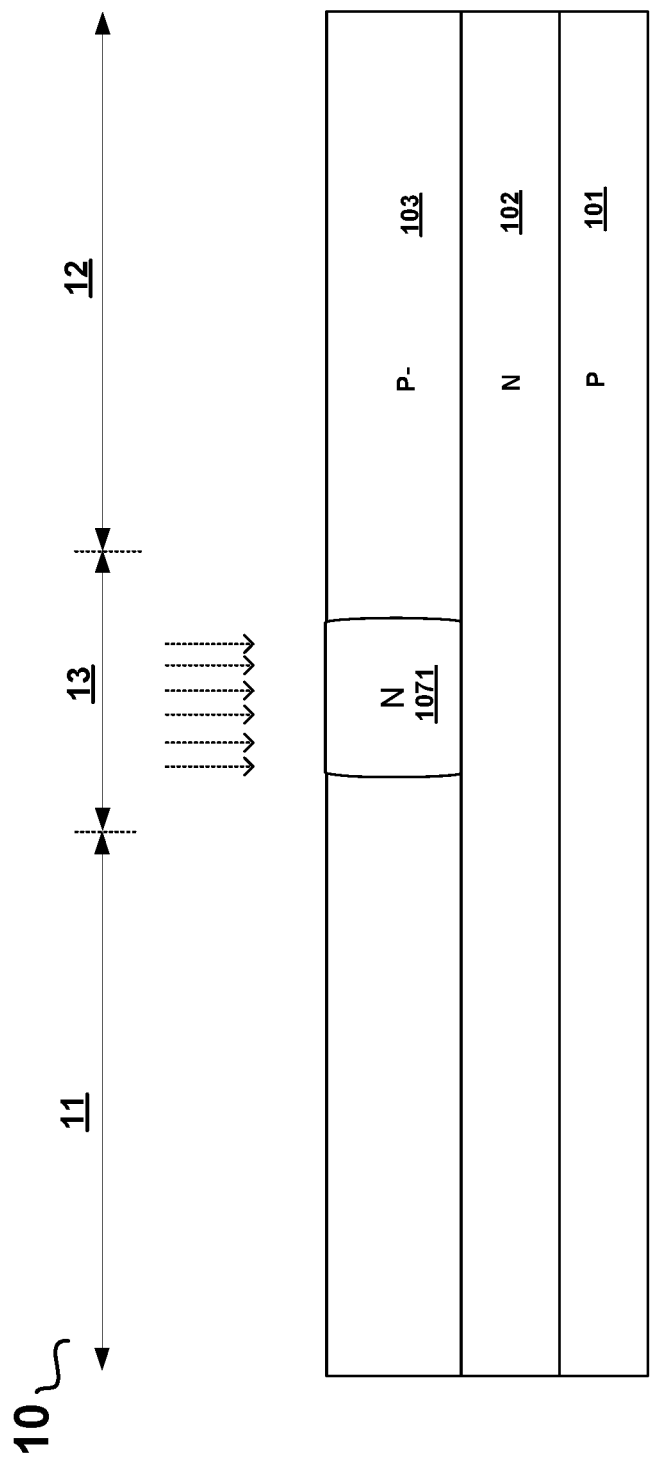

After that, referring to FIG. 4, a first isolation buried region 1071 is formed in the first epitaxial layer 103 at the isolation area 13. The first isolation buried region 1071 extends though the first epitaxial layer 103 from the top surface to the bottom surface of the first epitaxial layer 103 until the first buried layer 102 is reached. The first isolation buried region 1071 has the second conductive type (N type). In one embodiment, the first isolation buried region 1071 may be formed by injecting the ions with the second conductive type into the first epitaxial layer 103. Persons of ordinary skill in the art will appreciate that before the ion implantation a mask is formed upon the first epitaxial layer 103 having a patterned defined, e.g., by opening, typically having a width substantially corresponding to the width of the subsequently formed the first isolation buried region 1071. After ion implantation, ion diffusion is performed for forming the first isolation buried region 1071.

Figure 5:
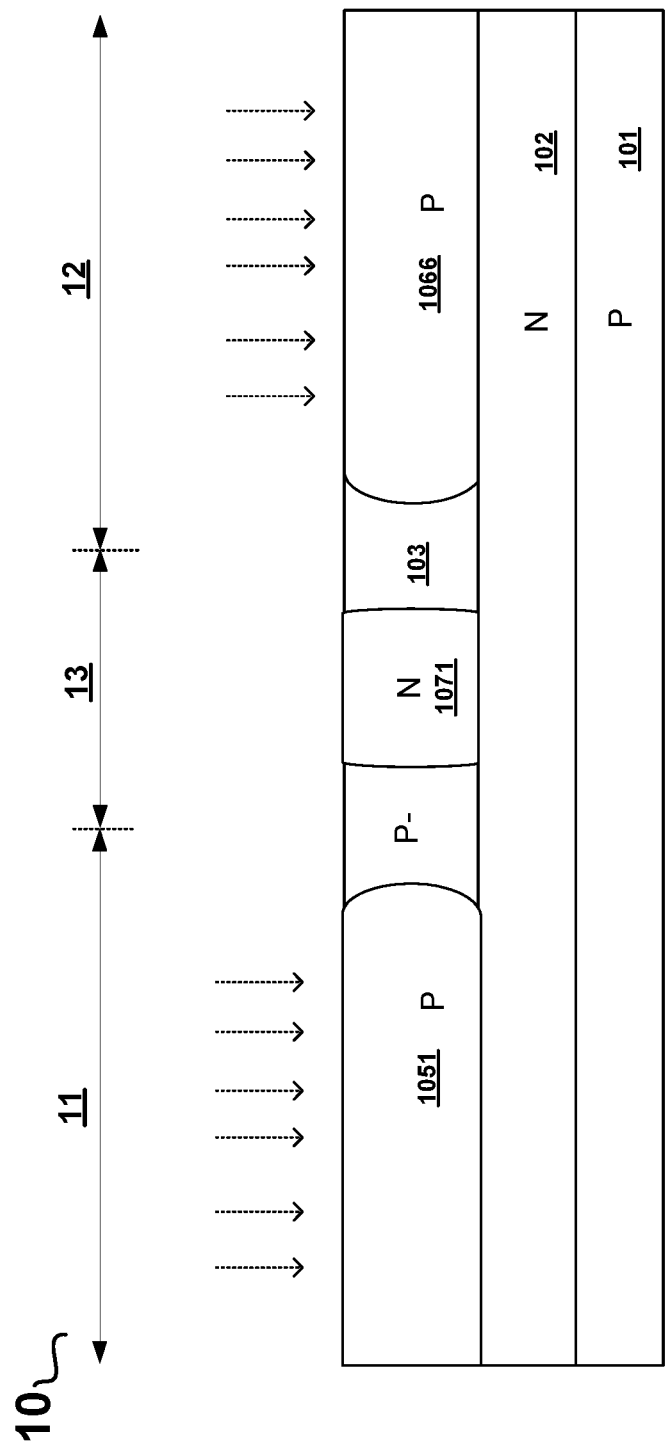
Figure 6:
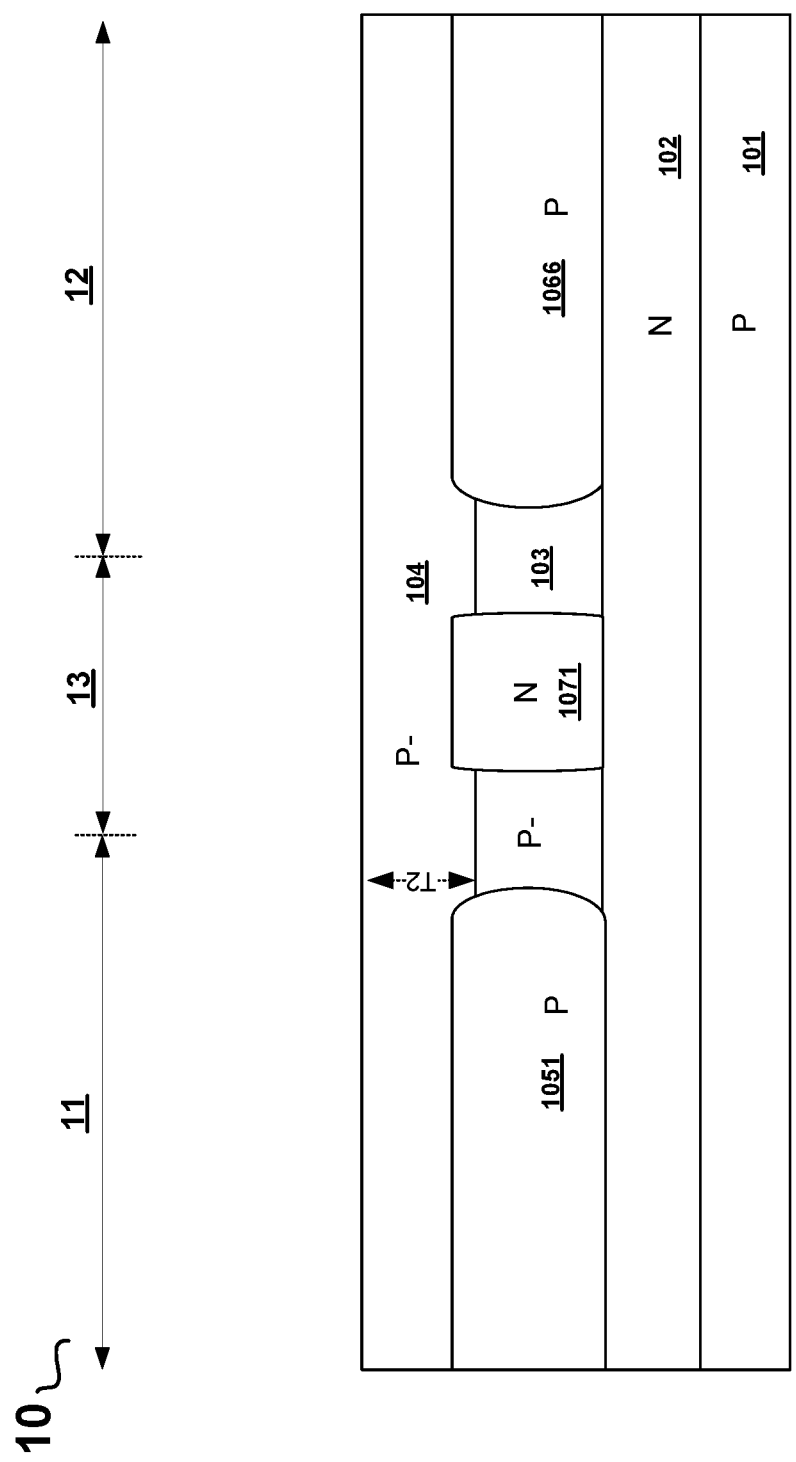

Next, referring to FIG. 5, a first collector buried region 1051 is formed in the first epitaxial layer 103 at the first active area 11 and extends through the first epitaxial layer 103 until the first buried layer 102 is reached. The first collector buried region 1051 has the first conductive type (P type) and functions as the collector region of the vertical PNP BJT unit 105. According to one embodiment of the invention, the second isolation buried region 1066 with the first conductive type can be formed during the formation of the first collector buried region 1051, thereby saving the steps. The second isolation buried region 1066 is formed in the first epitaxial layer 103 at the second active area 12 and extends through the first epitaxial layer 103 from the top surface of the first epitaxial layer 103 to contact with the first buried layer 102. The second isolation buried region 1066 is configured to isolate the vertical NPN BJT unit 106 from the first buried layer 102. In one embodiment, the first collector buried region 1051 and the second isolation buried region 1066 may be formed by injecting ions with the first conductive type in the first epitaxial layer 103. One critical problem is how to choose appropriately the dosage and energy used in this process. If the dosage is too high or the first buried layer 102 is coupled to the source of DMOS formed in the same process, the break voltage between the vertical NPN BJT unit 106 and the second isolation buried region 1066 will be too small, that may also lead to the silicon material defects. Otherwise, if the dosage is too low, the first collector buried region 1051 cannot play effectively the role of gathering the carrier, that may leads to easy turning-on of parasitic vertical PNP BJT because of its high current gain, wherein the parasitic vertical PNP BJT consists of the first base well region 1054, the second collector buried region 1051 and the first buried layer 102. Otherwise, if the dosage is too low, the second isolation buried region 1066 cannot provide the desired isolation. In one embodiment, the dosage for ion implantation is about 5E11 to 4E13, while the energy for ion implantation is about 200 keV to 1 MeV. Those skilled in the art should understand that before the ion implantation, a mask can be provided upon the first epitaxial layer 103 to define a selected portion of the first epitaxial layer 103 to be exposed for forming the first collector buried region 1051 and the second isolation buried region 1066, then ion diffusion is performed after the ion implantation. Thereafter, referring to FIG. 6, a second epitaxial layer 104 is formed on the first epitaxial layer 103. The second epitaxial layer 104 has the first conductive type (P– type), the dosage in the second epitaxial layer 104 is less than that in the substrate 101. In one embodiment, the second epitaxial layer 104 may be grown on the first epitaxial layer 103. During the growth of the second epitaxial layer 104, the first collector buried region 1051 and the first isolation buried region 1071 are diffused into the second epitaxial layer 104, as shown in FIG. 6. The second epitaxial layer 104 has a second thickness T2 which is also critical to the performance of the DMOS formed in the same process. In detail, if the second thickness T2 is too high, the contact resistance between the first buried layer 102 and a first isolation structure 107 formed in the following steps will be too high. Referring back to FIG. 1, if the second thickness T2 is too high, the contact resistance between the second isolation buried region 1066 and the second isolation well region 1067 will be too high. Therefore, the second thickness T2 needs be designed according to the applications. For example, the second thickness T2 is in a range form, but not limited to 1.2 μm to 4 μm.

Figure 7:
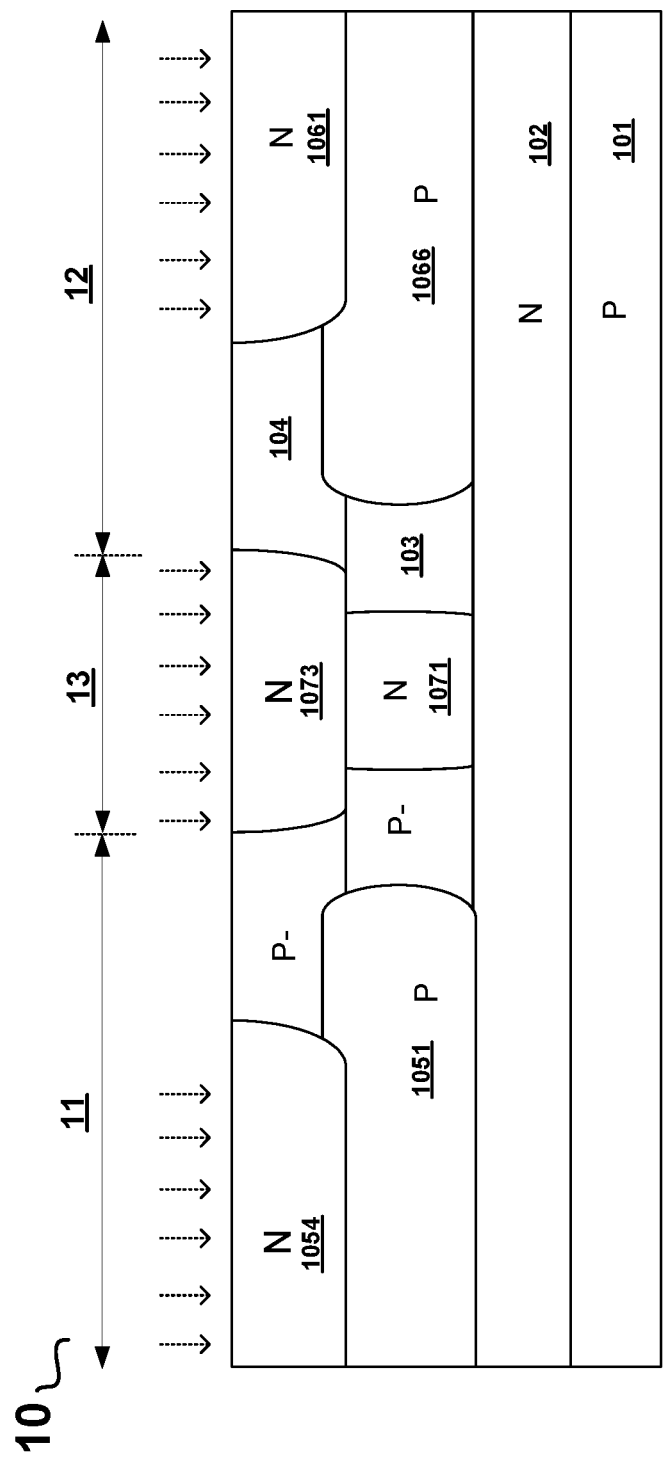

Then referring to FIG. 7, a first base well region 1054 is formed in the second epitaxial layer 104 at the first active area 11. The first base well region 1054 extends through the second epitaxial layer 104 to contact or have an overlap with the first collector buried region 1051. The first base well region 1054 has the second conductive type (N type) and functions as the collector region of the vertical PNP BJT unit 105. According to one embodiment of the prevention, during the formation of the first base well region 1054, the second collector well region 1061 can be formed at the same time to saving the steps. The second collector well region 1061 may be formed in the second epitaxial layer 104 at the second active area 12 and extends through the second epitaxial layer 104 to contact or have an overlap with the first epitaxial layer 103. The second collector well region 1061 functions as the collector region of the vertical PNP BJT unit 106. According to one embodiment of the present invention, during the formation of the first base well region 1054, a first isolation shallow well region 1073 can be formed at the same time to saving the steps. The first isolation shallow well region 1073 is formed in the second epitaxial layer 104 at the isolation area 13 and extends through the second epitaxial layer 104 to contact with a part of the first isolation buried region 1071. In one embodiment, the first base well region 1054, the second collector buried region 1061 and the first isolation shallow well region 1073, each of them can be formed by ion implantation using the ions with the second conductive type. Those skilled in the art should understand that before any ion implantation, the mask can be provided upon the second epitaxial layer 104 to define selected portions of the second epitaxial layer 104 to be exposed for forming the first base well region 1054, the second collector buried region 1061 and/or the first isolation shallow well region 1073. Then ion diffusion may be performed after the corresponding ion implantation. In another embodiment, the diffusion process may be performed at one time when all the implanted ions are ready to reduce steps.

Figure 8:
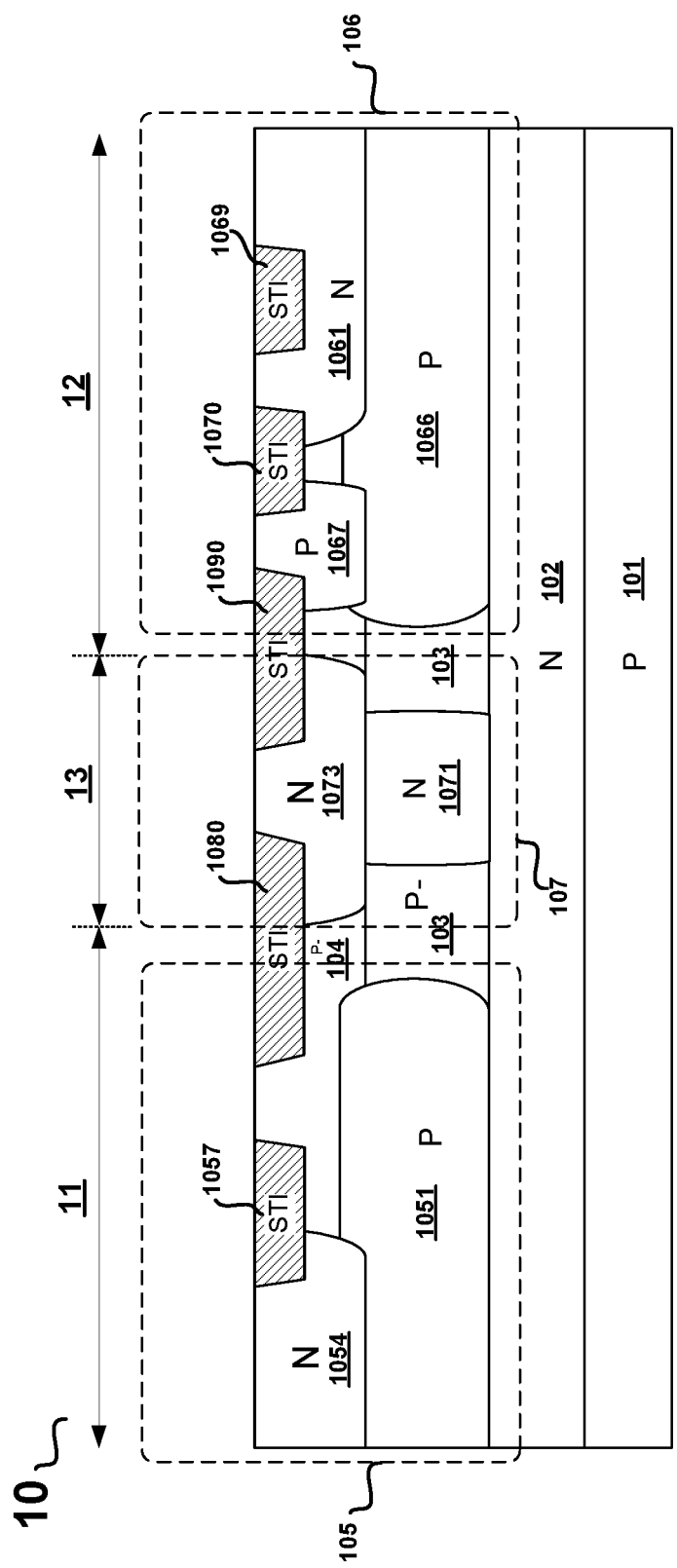

Next, referring to FIG. 8, a first STI region 1080 and a second STI region 1090 are formed in the second epitaxial layer 104. The first STI region 1080 is configured to isolate the PNP BJT unit 105 from the first isolation structure 107. The second STI region 1090 is configured to isolate the NPN BJT unit 106 from the first isolation structure 107. According to one embodiment of the present invention, the formation of the first STI region 1080, the second STI region 1090, the third STI region 1057, the fourth STI region 1069 and the fifth STI region 1070 may be formed at the same time.

Figure 9:
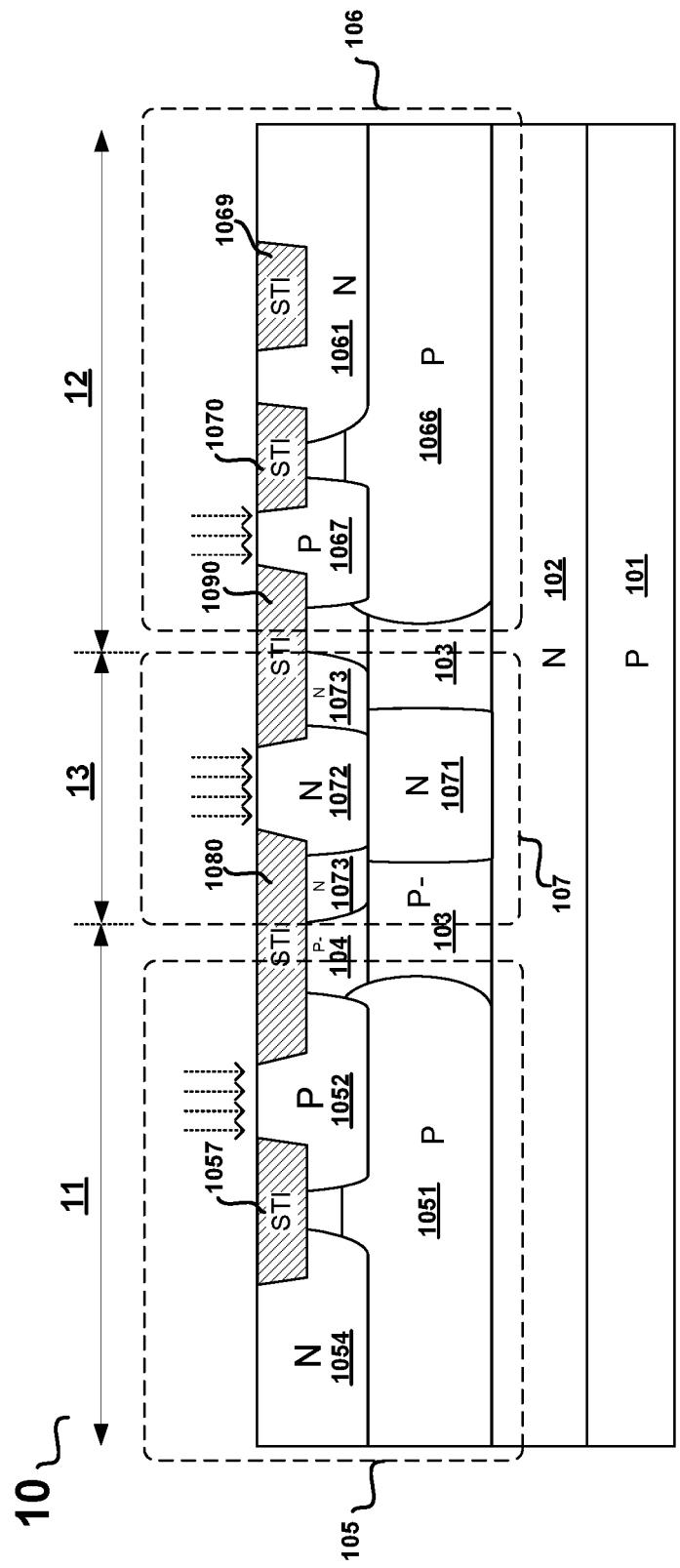

Subsequently, referring to FIG. 9, a first collector well region 1052 is further formed in the second epitaxial layer 104 at the first active area 11. The first isolation well region 1052 isolates form the first base well region 1054 formed previously and extends through the second epitaxial layer 104 to contact or have an overlap with the first collector buried region 1051. The first collector well region 1052 has the first conductive type (P type). The first collector well region 1052 together the first collector buried region 1051 functions as the collector region of the vertical PNP BJT unit 105. According to one embodiment of the present invention, the first collector well region 1052 and the second isolation well region 1067 with the first conductive type may be formed at the same time. The second isolation well region 1067 is formed the second epitaxial layer 104 at the second active area 12, isolates from the second collector well region 1061 formed previously and extends through the second epitaxial layer 104 to contact or have an overlap with the second isolation buried region 1066. In one embodiment, both the first collector well region 1052 and the second isolation well region 1067 may be formed by providing mask upon the second epitaxial layer 104 to define selected portions of the second epitaxial layer 104 to be exposed and then performing ion implantation to the selected portions of the second epitaxial layer 104 with the first conductive type (P type) ions. According to one embodiment of the present invention, the first isolation well region 1072 is further formed after the ion implantation of the first collector well region 1052 and the second isolation well region 1067. In another embodiment, the first isolation well region 1072 may be formed before the formation of the first collector well region 1052 and the second isolation well region 1067. The first isolation well region 1072 is formed in the second epitaxial layer 104 at the isolation area 13 and extends through the second epitaxial layer 104 to contact with a part of the first isolation buried region 1071. In the embodiments that the first isolation shallow well region 1073 already exists, the first isolation well region 1072 is formed in the first isolation shallow well region 1073. In one embodiment, the first isolation well region 1072 may be formed by providing mask upon the second epitaxial layer 104 or upon the first isolation shallow well region 1073 to define selected portions to be exposed and then performing ion implantation to the selected portions of the second epitaxial layer 104 or the first isolation shallow well region 1073 with the second conductive type (N type) ions. Then ion diffusion may be performed after the corresponding ion implantation. In another embodiment, the diffusion process may be performed at one time when all the implanted ions are ready to reduce steps.

Figure 10:
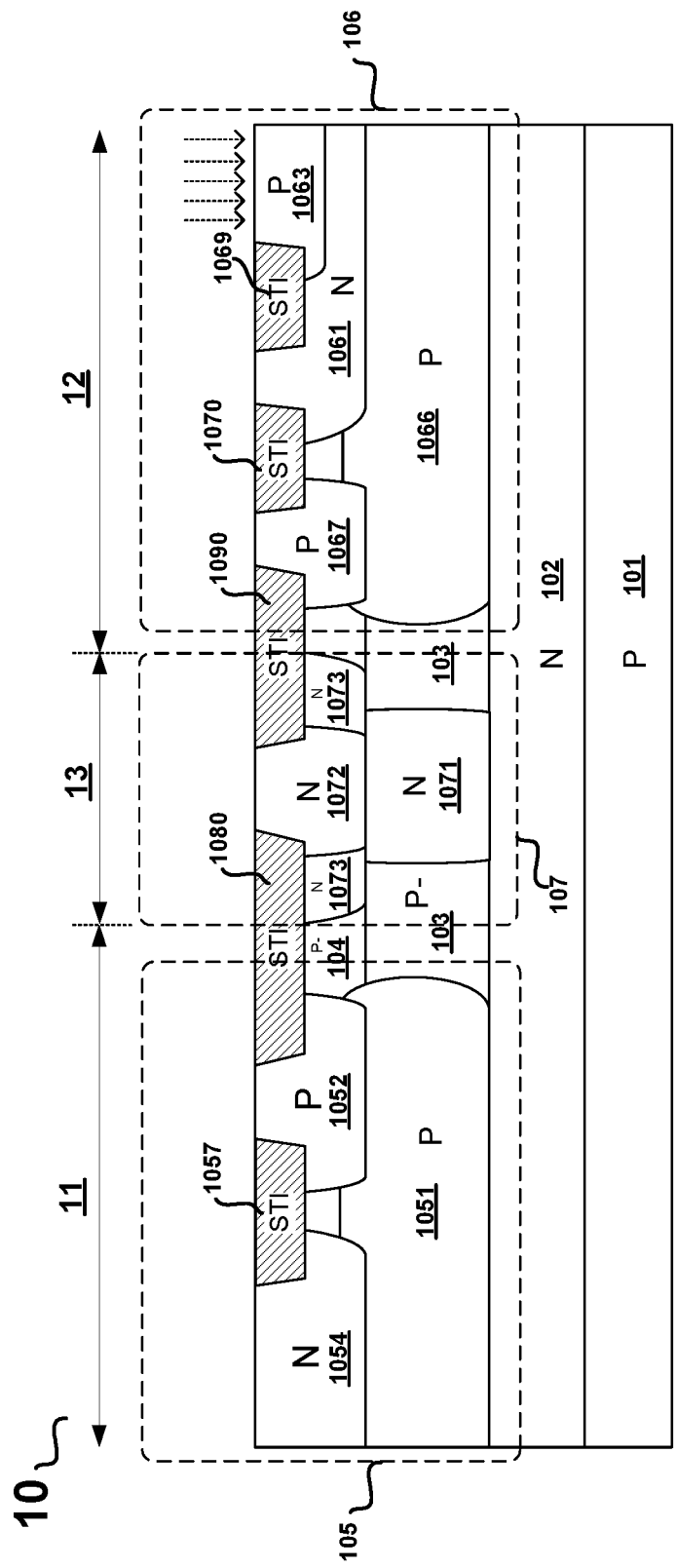

After that, referring to FIG. 10, a second base well region 1063 is formed in the second collector well region 1061.

Figure 11:
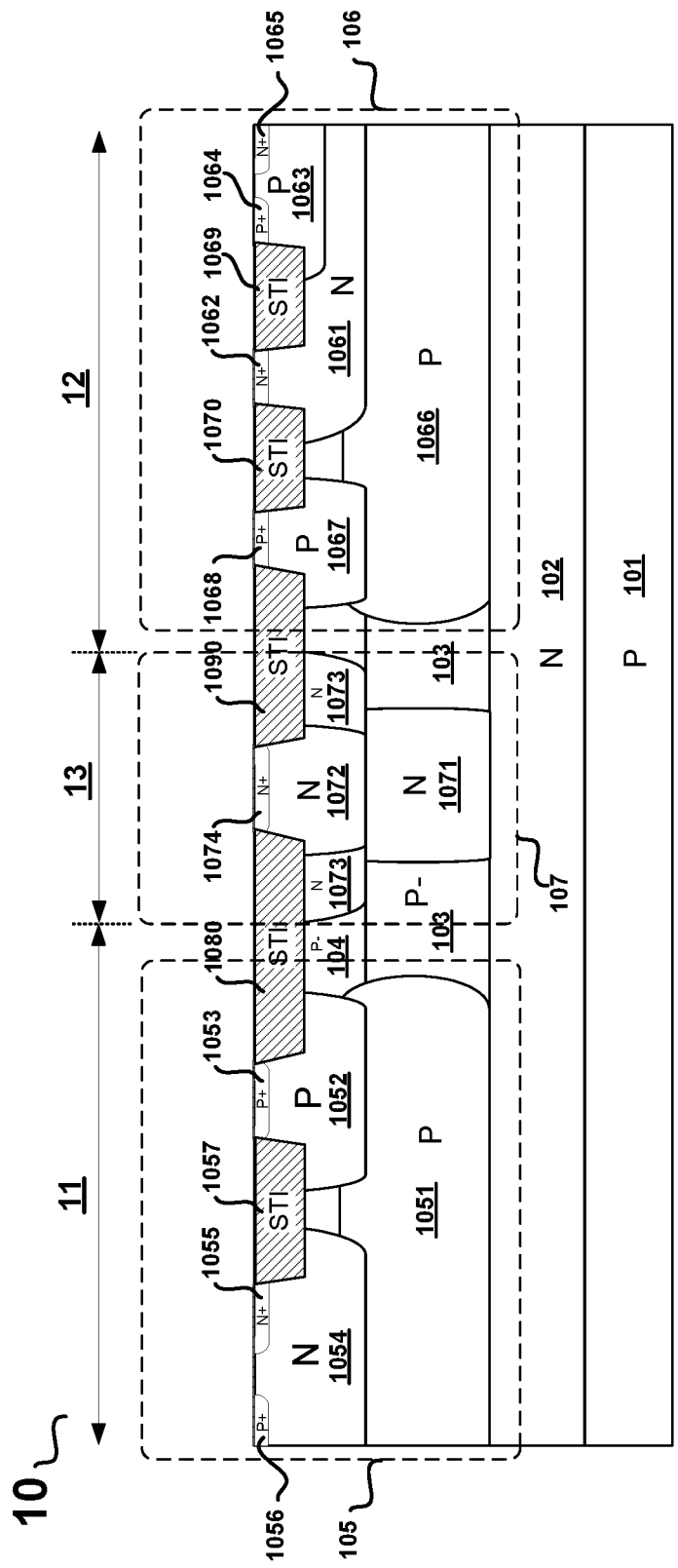

Then referring to FIG. 11, a first collector contact region 1053, a first base contact region 1055 and a first emitter region 1056 are formed for the vertical PNP BJT unit 105, a second collector contact region 1062, a second base contact region 1064 and a second emitter region 1065 are formed for the vertical NPN BJT unit 106, and a first isolation contact region 1074 is formed for the first isolation structure 107. In the embodiment of forming the second isolation structure shown in FIG. 1, a second isolation contact region 1068 is then formed for the second isolation structure at the step of FIG. 11.

The first collector contact region 1053 of the vertical PNP BJT unit 105 is formed in the first collector well region 1052, adjacent to the top surface of the first collector well region 1052. The first collector contact region 1053 has the first conductive type (P+ type) and the doping dosage in the first collector contact region 1053 is more than that in the first collector well region 1052. Both the first base contact region 1055 and the first emitter region 1056 may be formed in the first base well region 1054 and separates from each other, adjacent to the top surface of the first base well region 1054 respectively. The first base contact region 1055 has the second conductive type (N+ type) and the doping dosage in the first base contact region 1055 is more than that in the first base well region 1054, The first emitter region 1056 has the first conductive type (P+ type) and the doping dosage in the first emitter region 1056 is more than that in the first collector well region 1052.

The second collector contact region 1062 of the vertical NPN BJT unit 106 is formed in the second collector well region 1061, adjacent to the top surface of the second collector well region 1061. The second collector contact region 1062 has the second conductive type (N+ type) and the doping dosage in the second collector contact region 1062 is more than that in the second collector well region 1061. Both the second base contact region 1064 and the second emitter region 1065 may be formed in the second base well region 1063 and separates from each other, adjacent to the top surface of the second base well region 1063 respectively. The second base contact region 1064 has the first conductive type (P+ type) and the doping dosage in the second base contact region 1064 is more than that in the second base well region 1063, The second emitter region 1065 has the second conductive type (N+ type) and the doping dosage in the second emitter region 1065 is more than that in the second collector well region 1061.

The first isolation contact region 1074 of the first isolation structure 107 is formed in the first isolation well region 1072, adjacent to the top surface of the first isolation well region 1072. The first isolation contact region 1074 has the second conductive type (N+ type) and the doping dosage in the first isolation contact region 1074 is more than that in the first isolation well region 1072.

The second isolation contact region 1068 of the second isolation structure is formed in the second isolation well region 1067, adjacent to the top surface of the second isolation well region 1067. The second isolation contact region 1068 has the first conductive type and the doping dosage in the second isolation contact region 1068 is more than that in the second isolation well region 1067 (P+ type).

According to one embodiment of the present invention, the first collector contact region 1053, the first base contact region 1055, the first emitter region 1056, the second collector contact region 1062, the second base contact region 1064, the second emitter region 1065, the first isolation contact region 1074 and the second isolation contact region 1068, each of them may be formed in the corresponding region by ion implantation with the appropriate conductive type ions, the detailed description are herein omitted for clarity. For example, the first collector contact region 1053, the first emitter region 1056, the second base contact region 1064 and the second isolation contact region 1068 with the first conductive type may be formed in the same process by ion implantation with the first conductive type ions. The first base contact region 1055, the second collector contact region 1062, the second emitter region 1065 and the first isolation contact region 1074 with the second conductive type may be formed in the same process by ion implantation with the second conductive type ions. Those skilled in the art should understand that providing a mask to define the selected portion before the ion implantation and performing ion diffusion after the ion implantation are necessary, which can be omitted for clarity.

Figure 12:
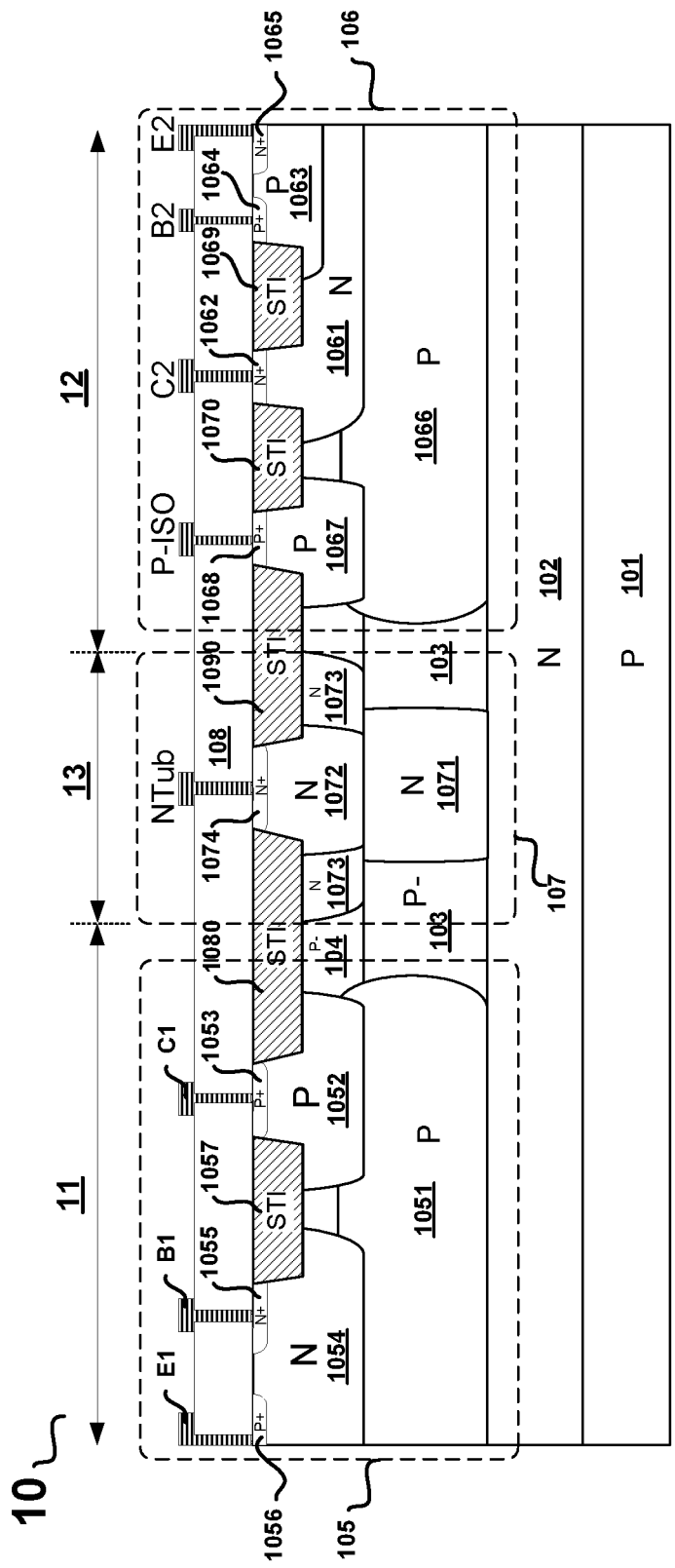

Subsequently, referring to FIG. 12, an interlayer dielectric layer (IDL) 108 is formed on the second epitaxial layer 104 and over its entire surface, then the first openings corresponding to the PNP BJT unit 105, the second openings corresponding to the NPN BJT unit 106 and the third opening corresponding to the first isolation structure 107 and the fourth opening corresponding to the second isolation structure are formed in the IDL 108, respectively. After that, a collector electrode C1, a base electrode B1 and an emitter electrode E1 of the PNP BJT unit 105 are electrically connected to the first collector contact region 1053, the first base contact region 1055 and the first emitter region 1056 through the first openings in the IDL 108, respectively, thus providing electrical path for the collector, base and the emitter of the PNP BJT unit 105 with external circuits. In this process, a collector electrode C2, a base electrode B2 and an emitter electrode E2 of the NPN BJT unit 106 may be electrically connected to the second collector contact region 1062, the second base contact region 1064 and the second emitter region 1065 through the second openings in the IDL 108, respectively, thus providing electrical path for the collector, base and the emitter of the NPN BJT unit 106 with external circuits. Besides, in the same process, a first isolation electrode NTub may be formed for the first isolation structure 107 and then be electrically connected to the first isolation contact region 1074 through the third opening in the IDL 108. Furthermore, in the same process, a second isolation electrode P-ISO may be formed for the second isolation structure then be electrically connected to the second isolation contact region 1068 through the fourth opening in the IDL 108.

Methods and processes of forming a bipolar junction semiconductor device 10 described in various embodiments with reference to FIGS. 2-12 are illustrative and not intended to be limiting. Well known manufacturing steps, processes, materials and dopants etc. are not described in detail to avoid obscuring aspects of the technology. Those skilled in the art should understand that the steps described in the embodiments shown may be implemented in different orders and are not limited to the embodiments described.

From the foregoing, it will be appreciated that specific embodiments of the present invention have been described herein for purposes of illustration, but that various modifications may be made without deviating from the spirit and scope of various embodiments of the present invention. Many of the elements of one embodiment may be combined with other embodiments in addition to or in lieu of the elements of the other embodiments. Accordingly, the present invention is not limited except as by the appended claims.

What is claimed is:

1. A bipolar junction semiconductor device, comprising:
   a semiconductor substrate with a first conductive type;
   a first buried layer formed in the semiconductor substrate, the first buried layer has a second conductive type opposite to the first conductive type;
   a first epitaxial layer formed on the first buried layer, the first epitaxial layer has the first conductive type;
   a second epitaxial layer formed on the first epitaxial layer, the second epitaxial layer has the first conductive type;
   a PNP bipolar junction transistor (BJT) unit formed in the first and second epitaxial layers at a first active area;
   a NPN BJT unit formed in the first and second epitaxial layers at a second active area; and
   a first isolation structure having the second conductive type and formed in the first and second epitaxial layers at an isolation area, wherein the isolation area is located between the first active area and the second active area, the first isolation structure connected with the first buried layer forms an isolation barrier with the second conductive type.

2. The bipolar junction semiconductor device of claim 1, wherein the first isolation structure comprises:
   a first isolation buried region formed in the first epitaxial layer at the isolation area, wherein the first isolation buried region extends through the first epitaxial layer from the top surface of the first epitaxial layer until the first buried layer is reached; and
   a first isolation well region formed in the second epitaxial layer at the isolation area, wherein the first isolation well region extends through the second epitaxial layer to at least contact with a part of the first isolation buried region.

3. The bipolar junction semiconductor device of claim 2, wherein the first isolation structure further comprises:
   a first isolation contact region formed in the first isolation well region, the doping dosage in the first isolation contact region is more than that in the first isolation well region.

4. The bipolar junction semiconductor device of claim 2, wherein the first isolation structure further comprises:
   a first isolation shallow well region formed in the second epitaxial layer at the isolation area, wherein the first isolation shallow well region extends through the second epitaxial layer to at least contact with a part of the first isolation buried region, the first isolation shallow well region surrounds the first isolation well region, the doping dosage in the first isolation shallow well region is less than that in the first isolation well region.

5. The bipolar junction semiconductor device of claim 1, wherein the PNP BJT unit comprises:
   a first collector buried region having the first conductive type and formed in the first epitaxial layer at the first active area;
   a first collector well region having the first conductive type and formed in the second epitaxial layer at the first active area;
   a first base well region having the second conductive type and formed in the second epitaxial layer at the first active area, wherein the first base well region isolates from the first collector well region; and
   a first emitter region having the first conductive type and formed in the first base well region.

6. The bipolar junction semiconductor device of claim 5, wherein the PNP BJT unit further comprises:
   a first collector contact region having the first conductive type and formed in the first collector well region; and
   a first base contact region having the second conductive type and formed in the first base well region, wherein the first base contact region isolates form the first emitter region.

7. The bipolar junction semiconductor device of claim 1, wherein the NPN BJT unit comprises:
   a second collector well region having the second conductive type and formed in the second epitaxial layer at the second active area;
   a second base well region having the first conductive type and formed in the second collector well region; and
   a second emitter region having the second conductive type and formed in the second base well region, wherein the doping dosage in the second emitter region is more than that in the second collector well region.

8. The bipolar junction semiconductor device of claim 7, wherein the NPNBJT unit further comprises:
   a second collector contact region having the second conductive type and formed in the second collector well region, the doping dosage in the second collector contact region is more than that in the second collector well region; and
   a second base contact region having the first conductive type and formed in the second base well region, the second base contact region isolates form the second emitter region, the doping dosage in the second base contact region is more than that in the second base well region.

9. The bipolar junction semiconductor device of claim 1, further comprises a second isolation structure with the first conductive type, wherein the second isolation structure comprises:
   a second isolation buried region formed in the first epitaxial layer at the second active area, wherein the second isolation buried region extends through the first epitaxial layer from the top surface of the first epitaxial layer until the first buried layer is reached; and
   a second isolation well region formed in the second epitaxial layer at the second active area, wherein the second isolation well region extends through the second epitaxial layer to contact or have an overlap with a part of the second isolation buried region, the second isolation well region together with the second isolation buried region wraps the NPN BJT unit.

10. A method for manufacturing a bipolar junction semiconductor device, comprising:
    providing a semiconductor substrate with a first conductive type, wherein the semiconductor substrate was divided into three parts: a first active area, a second active area and an isolation area, wherein the isolation area is located between the first active area and the second active area;
    forming a first buried layer in the semiconductor substrate, wherein the first buried layer has a second conductive type opposite to the first conductive type;
    forming a first epitaxial layer with the first conductive type on the first buried layer;
    forming a first isolation buried region with the second conductive type in the first epitaxial layer at the isolation area, the first isolation buried region extends through the first epitaxial layer from the top surface of the first epitaxial layer until the first buried layer is reached;
    forming a first collector buried region with the first conductive type in the first epitaxial layer at the first active area;
    forming a second epitaxial layer with the first conductive type on the first epitaxial layer;
    forming a first base well region with the second conductive type in the second epitaxial layer at the first active area;
    forming a second collector well region with the second conductive type in the second epitaxial layer at the second active area;
    further forming a first collector well region with the first conductive type in the second epitaxial layer at the first active area, wherein the first collector well region isolates from the first base well region;
    forming a first isolation well region with the second conductive type in the second epitaxial layer at the isolation area, wherein the first isolation well region extends through the second epitaxial layer to at least contact a part of the first isolation buried region;
    forming a second base well region in the second collector well region;
    forming a first collector contact region with the first conductive type in the first collector well region, forming a first base contact region with the second conductive type and a first emitter region with the first conductive type in the first base well region, wherein the first emitter region isolates from the first base contact region;
    forming a second collector contact region with the second conductive type in the second collector well region, forming a second base contact region with the first conductive type and a second emitter region with the second conductive type in the second base well region, wherein the second emitter region isolates from the second base contact region; and
    forming a first isolation contact region with the second conductive type in the first isolation well region.

11. The method of claim 10, further comprises:
    forming a first isolation shallow well region with the second conductive type in the second epitaxial layer at the isolation area, wherein the first isolation shallow well region extends through the second epitaxial layer to contact a part of the first isolation buried region.

12. The method of claim 11, wherein the first isolation shallow well region and the first base well region are formed at the same step.

13. The method of claim 10, wherein the first collector buried region extends through the first epitaxial layer from the top surface of the first epitaxial layer until the first buried layer is reached.

14. The method of claim 10, wherein the first base well region extends through the second epitaxial layer to contact or have an overlap with the first collector buried region.

15. The method of claim 10, wherein the first collector well region extends through the second epitaxial layer to contact or have an overlap with the first collector buried region.

16. The method of claim 10, wherein the first epitaxial layer has a first thickness and the doping dosage in the first epitaxial layer is less than that in the semiconductor substrate.

17. The method of claim 16, wherein the first thickness is at 4 μm to 10 μm.

18. The method of claim 10, wherein the second epitaxial layer has a second thickness and the doping dosage in the second epitaxial layer is less than that in the semiconductor substrate.

19. The method of claim 18, wherein the second thickness is at 1.2 μm to 4 μm.

20. The method of claim 10, further comprises:
forming a second isolation buried region with the first conductive type in the first epitaxial layer at the second active area, wherein the second isolation buried region extends through the first epitaxial layer from the top surface of the first epitaxial layer until the first buried layer is reached; and
forming a second isolation well region with the first conductive type in the second epitaxial layer at the second active area, wherein the second isolation well region extends through the second epitaxial layer to contact or have an overlap with the second isolation buried region.

21. The method of claim 20, wherein the second isolation buried region and the first collector buried region are formed at the same step, the second isolation well region and the first collector well region are formed at the same step.

* * * * *